(12) United States Patent
Chida

(10) Patent No.: US 6,252,800 B1
(45) Date of Patent: Jun. 26, 2001

(54) SEMICONDUCTOR MEMORY DEVICE

(75) Inventor: Tetsuya Chida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/448,172

(22) Filed: Nov. 24, 1999

(30) Foreign Application Priority Data

Nov. 24, 1998 (JP) .................................................. 10-332884

(51) Int. Cl.⁷ .................................................. G11C 16/04
(52) U.S. Cl. ............... 365/185.11; 365/200; 365/230.01; 365/230.03; 365/230.06
(58) Field of Search ................................. 365/200, 201, 365/230.03, 185.11, 203.06

(56) References Cited

U.S. PATENT DOCUMENTS

| | | | |
|---|---|---|---|
| 5,563,828 | * 10/1996 | Hasbun et al. | 365/185.33 |
| 5,930,815 | * 7/1999 | Estakhri et al. | 711/103 |
| 5,973,964 | * 10/1999 | Tobita et al. | 364/185.29 |
| 6,014,755 | * 1/2000 | Wells et al. | 714/8 |

FOREIGN PATENT DOCUMENTS

| | | |
|---|---|---|
| 404120639A | * 4/1992 | (JP) . |
| 406119254A | * 4/1994 | (JP) . |
| 406149679A | * 5/1994 | (JP) . |
| 410275113A | * 10/1998 | (JP) . |
| 411065941A | * 3/1999 | (JP) . |

* cited by examiner

Primary Examiner—Viet Q. Nguyen
(74) Attorney, Agent, or Firm—Arent Fox Kintner Plotkin & Kahn, PLLC

(57) ABSTRACT

A semiconductor memory device which can quickly and certainly read out block valid/invalid information is provided. This semiconductor memory device includes a memory cell array having memory cells arranged in rows and columns, and a valid/invalid information storage unit which stores valid/invalid information of the respective memory cells. The valid/invalid information storage unit is disposed outside the memory cell array.

9 Claims, 7 Drawing Sheets

SEMICONDUCTOR MEMORY DEVICE

BACKGROUND OF THE INVENTION

1. Field of the Invention

The present invention generally relates to semiconductor memory devices, and, more particularly, to a non-volatile semiconductor device which is electrically erasable and rewritable.

In recent years, various types of flash EEPROM (hereinafter referred to as "flash memory") have been developed as non-volatile semiconductor memory devices which are electrically erasable and rewritable. In particular, cell-type flash memory (hereinafter referred to as "NAND-type flash memory") has been used for files to store a large amount of data, and its memory capacity has been increasing. As the memory capacity of the NAND-type flash memory has increased, the number of memory cell transistors for storing information in the NAND-type flash memory has also increased. For instance, a flash memory having a 16-Mbit capacity contains 16,777,216 memory cell transistors, and a flash memory having a 64-Mbit capacity contains 67,108,864 memory cell transistors. For such a NAND-type flash memory, a product quality test is performed on every memory cell transistor after the completion of the NAND-type flash memory. The NAND-type flash memory performs erasure by the block, which is a group of memory cell transistors. A block consisting of memory cell transistors judged to be defective through the product quality test is called a bad block (invalid block). Such a bad block might occur during the operation of the flash memory. Once a bad block is spotted, no access is allowed to the bad block. Information indicating whether the blocks are valid or invalid is called block valid/invalid information.

2. Description of the Related Art

FIG. 1 is a block diagram of a conventional NAND-type flash memory. This block diagram includes a row address buffer 10, a column address buffer 12, an address register 14, a select Tr decoder 16, a row address decoder 18, a column address decoder 20, a control and high-voltage circuit 22, a command register 24, a memory cell array 26, a Y gate 28, a sense amplifier 30, a data register 32, and an input/output control circuit 34.

The entire operation of the NAND-type flash memory is controlled by a command signal. The command signal, an address signal, and a data signal are supplied to the input/output control circuit 34 via input/output terminals i/o0 to i/o7. The input/output control circuit 34 sends the supplied command signal, address signal, and data signal to the command register 24, the address register 14, and the data register 32, respectively, in accordance with the combination of control signals supplied to the control and high-voltage circuit 22.

The command register 24 latches the supplied command signal, and supplies the latched command signal to the control and high-voltage circuit 22 at desired timing. The control and high-voltage circuit 22 then decodes the command signal, and outputs a control signal to the row address decoder 18, the memory cell array 26, the sense amplifier 30, or the data register 32, whichever is required to perform a process based on the command signal.

The address register 14 latches the supplied address signal, and supplies the latched address signal to the row address buffer 10 and the column address buffer 12 at desired timing. The row address buffer 10 supplied with the address signal from the address register 14 sends the address signal to the select Tr decoder 16 and the row address decoder 18 at desired timing. The column address buffer 12 supplied with the address signal from the address register 14 sends the address signal to the column address decoder 20 at desired timing.

The select Tr decoder 16 outputs a select transistor control signal SL for controlling select transistors included in the memory cell array 26 based on the address signal. The row address decoder 18 decodes the supplied address signal to output a word line signal WL. In accordance with the select transistor control signal SL and the word line signal WL, a data signal selected from cell blocks constituting the memory cell array 26 is sent to the Y gate 28.

The column address decoder 20 decodes the supplied address signal to output a signal for controlling the Y gate 28. The Y gate 28 selects a necessary data signal from data signals supplied from the memory cell array 26, and supplies the selected data signal to the data register 32 via the sense amplifier 30. The data register 32 latches the data signal supplied through the sense amplifier 30, and then sends the data signal to the input/output control circuit 34 at desired timing. The input/output control circuit 34 sequentially outputs data signals in accordance with a clock signal.

FIG. 2 is a timing chart of a data signal reading operation of the NAND-type flash memory of FIG. 1. In the following, signals provided with "/" are negative logic signals, and the other signals are positive logic signals.

When a chip enable signal /CE is inputted into the control and high-voltage circuit 22, a command signal, address signals, and data signals are supplied to the input/output control circuit 34 based on the timing of a write enable signal /WE. Here, the type of the signal to be supplied to the input/output control circuit 34 is determined in accordance with a command latch enable signal CLE and an address latch enable signal ALE supplied to the control and high-voltage circuit 22. More specifically, a signal supplied to the input/output control circuit 34 at the same time as the command latch enable signal CLE is a command signal, and a signal supplied to the input/output control circuit 34 at the same time as the address latch enable signal ALE is an address signal. Accordingly, a command signal (00H) and address signals (A0 to A22) are supplied to the input/output control circuit 34 in the timing chart of FIG. 2.

Data signals are then read from the memory cell array 26, and are outputted sequentially from the input/output control circuit 34 via the Y gate 28, the sense amplifier 30, and the data register 32, in accordance with the timing of a read enable signal /RE.

In the NAND-type flash memory 1 described above, the management side possesses the block valid/invalid information of the blocks. Therefore, it is necessary to produce a table of the block valid/invalid information for each block. Generally, the block valid/invalid information of each block is coded and written in a predetermined position in each corresponding block. Each block is judged whether it is a bad block from the code written in the predetermined position.

When producing a table of the block valid/invalid information, the management side reads out the data of the memory cells of all the blocks, and produces the table of the block valid/invalid information based on the block valid/invalid information contained in the read data. In accordance with the table of the block valid/invalid information, the management side disables access to bad blocks. The table of the block valid/invalid information is updated when a new bad block occurs during an operation of the NAND-type flash memory 1.

In the above conventional structure, however, it is necessary to read out the data of all the blocks to produce the table of the block valid/invalid information. Generally, the NAND-type flash memory is read by the page, for instance, which is a unit of data of one word line, and reading one page of data from the memory cells into the data register 32 requires a certain period of time. Accordingly, producing a table of block valid/invalid information for a larger number of blocks takes a longer period of time.

In a case where it takes 600 ps (microseconds) to read the data of one block, for instance, producing a table of block valid/invalid information for 1000 blocks requires at least 600 ms (milliseconds). Also, in a case where the position of the code indicating the block valid/invalid information becomes defective, there is a problem that the block valid/invalid information cannot be correctly recognized.

SUMMARY OF THE INVENTION

A general object of the present invention is to provide a semiconductor memory device in which the above disadvantages are eliminated.

A more specific object of the present invention is to provide a semiconductor memory device which enables high-speed and accurate reading of block valid/invalid information.

The above objects of the present invention are achieved by a semiconductor memory device comprising: a memory cell array including blocks, each of the blocks having memory cells arranged in rows and columns; and a valid/invalid information storage unit which is connected to the memory cell array and stores pieces of valid/invalid information respectively indicating whether the blocks are valid or invalid.

In this structure, the valid/invalid information storage unit that stores the valid/invalid information is independent of the memory cells, and accurate reading of the valid/invalid information can be performed at high speed. The amount of data of the valid/invalid information stored in the valid/invalid information storage unit is far smaller than the amount of data stored in the memory cells, and the constitution of the valid/invalid information storage unit is simpler accordingly. Thus, the valid/invalid information storage unit enables high-speed and accurate reading of the valid/invalid information.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 3:
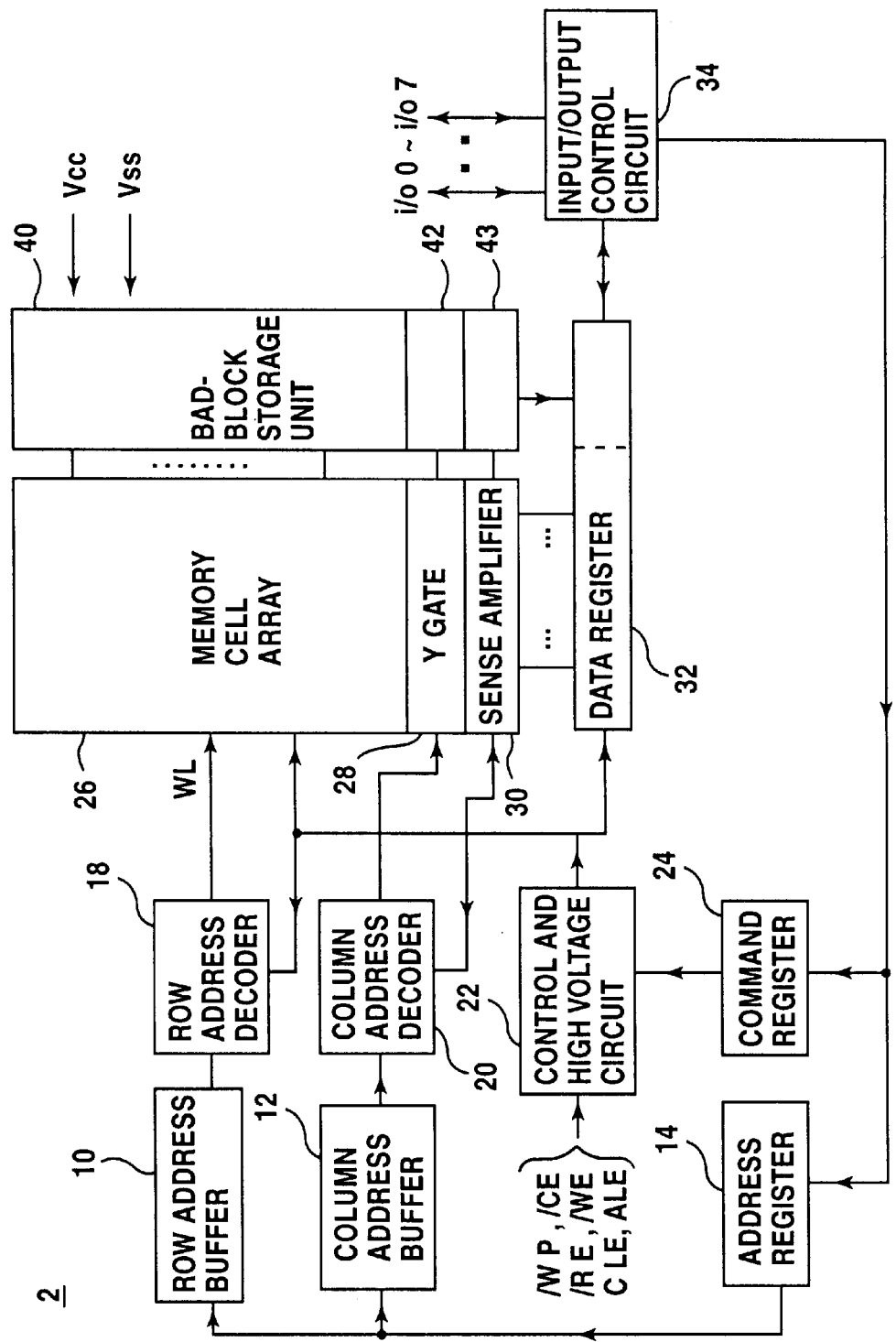
FIG. 3 is a block diagram of a first embodiment of a semiconductor memory device of the present invention.

FIG. 3 is a block diagram of a first embodiment of a semiconductor memory device of the present invention. In FIG. 3, the same components as in the block diagram of FIG. 1 are indicated by the same reference numerals.

Figure 1:
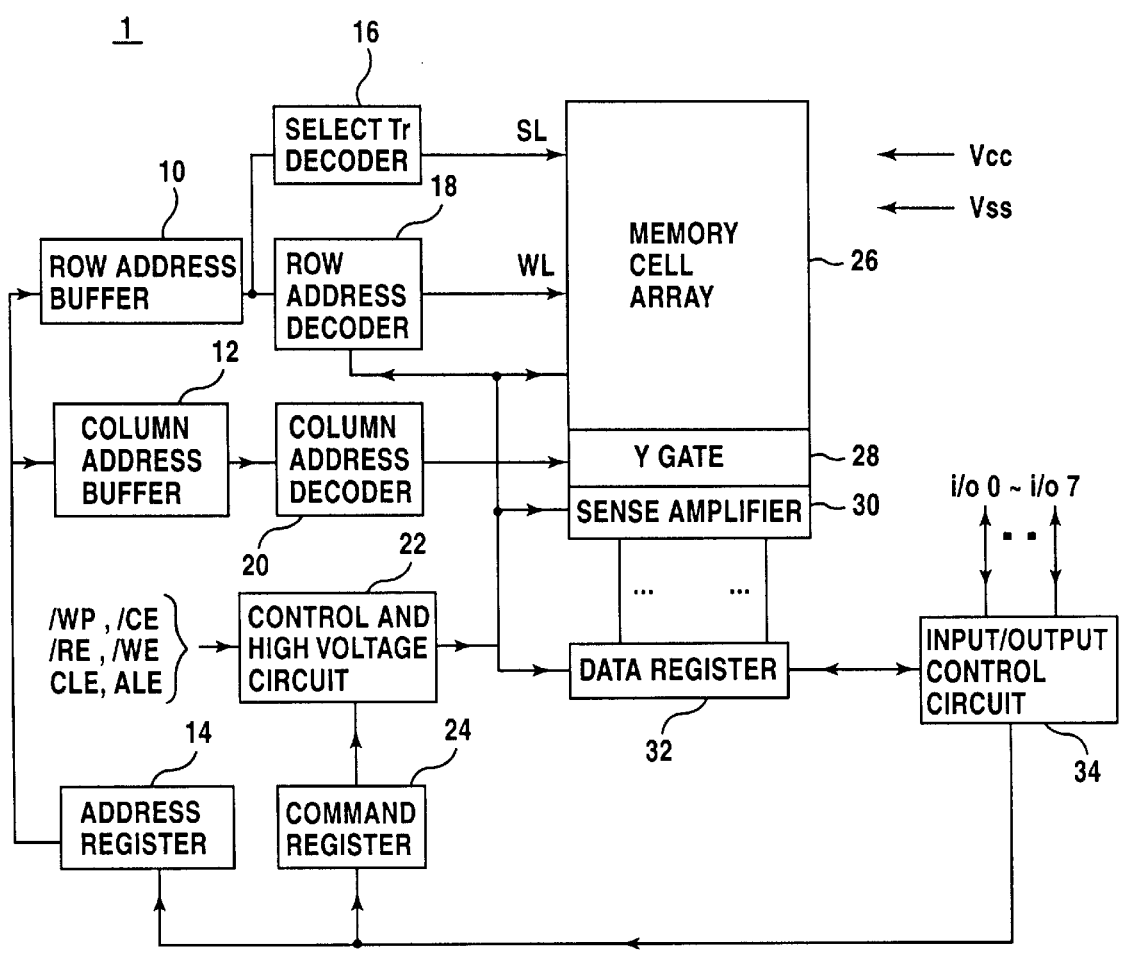
FIG. 1 is a block diagram of a NAND-type flash memory of the prior art.
Figure 2:
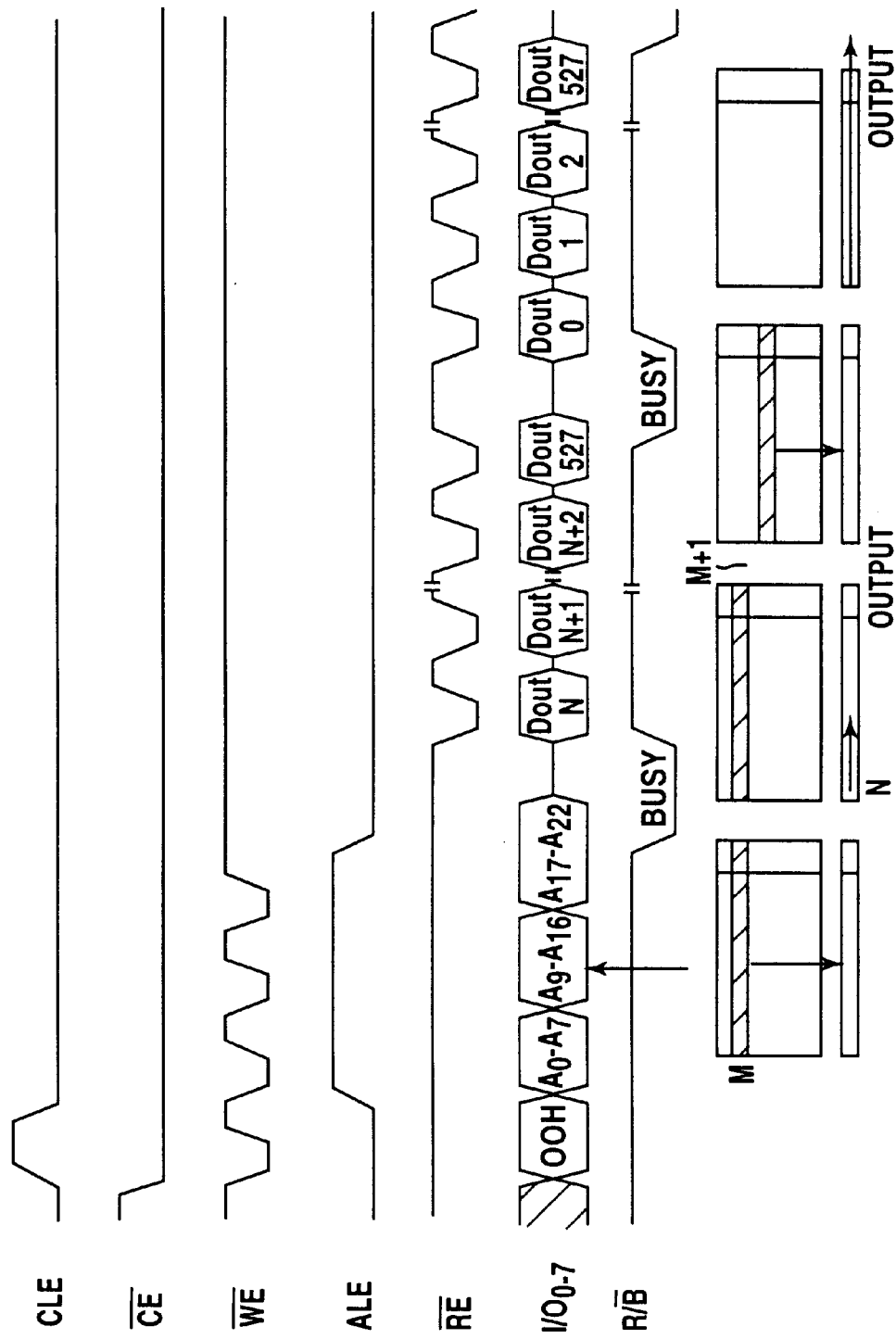
FIG. 2 is a timing chart of a data signal reading operation of the NAND-type flash memory.

A semiconductor memory device 2 of the present invention shown in FIG. 3 includes a bad-block storage unit 40 which is not shown in the diagram of FIG. 1. The bad-block storage unit 40 comprises a bad-block storage 41, a Y gate 42, and a sense amplifier 43. The Y gates 28 and 42 conduct switching between the bad-block storage 41 and the memory cell array 26. In accordance with a command signal or a high-voltage signal supplied to the control and high-voltage circuit 22, the switching is performed between the Y gates 28 and 42. A signal for selecting from data stored in the bad-block storage 41 is supplied from the row address decoder 18 in the same way that a signal is supplied to the memory cell array 26. In accordance with the signal for selecting, the block valid/invalid information corresponding to a subject block is read out. In this structure, the block valid/invalid information that has been conventionally written in a predetermined position in each block can be written in the bad-block storage unit 40.

To judge whether a block is a bad block, the block valid/invalid information requires only 1 bit for each block. If the block valid/invalid information for a subject block is "0", the block is a bad block. If the block valid/invalid information is "1", the block is not a bad block. However, in a case where a decision-by-majority system using a plurality of bits is employed to improve the reliability, one block should consist of the same number of bits. In the decision-by-majority system using a plurality of bits, if 3-bit block valid/invalid information is "0, 0, 1", for instance, the corresponding block is judged to be "0", i.e., a bad block.

As described above, the bad-block storage unit 40 stores a far smaller amount of data than the memory cell array 26, and can be made simpler in design while achieving high reliability. When producing a table of block valid/invalid information, it has been necessary to read out the data of each block in the prior art. However, the bad-block storage unit 40 of the present invention dramatically reduces the amount of data to be read out, and thus speeds up the process.

Figure 4:
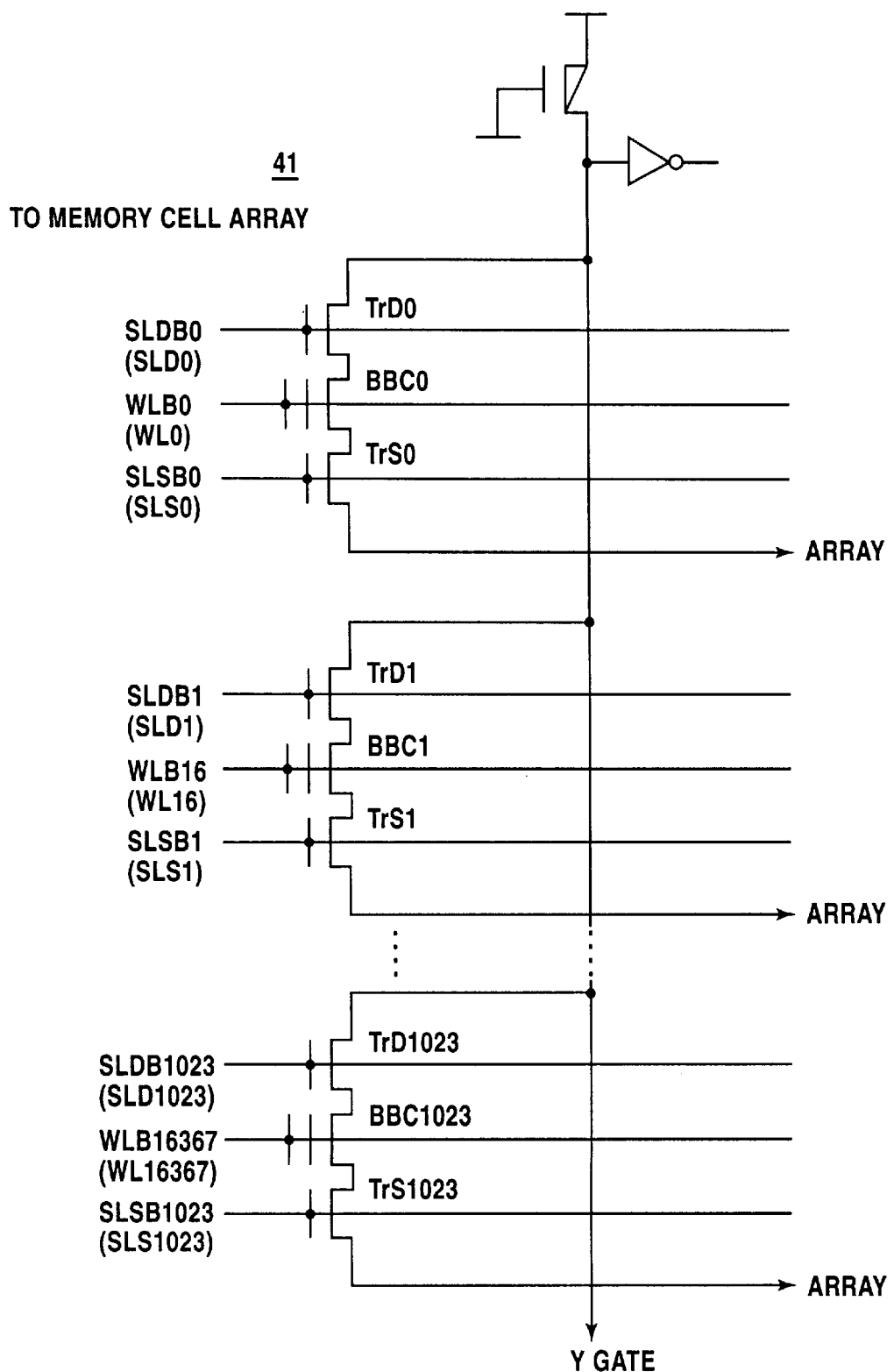
FIG. 4 is a circuit diagram of a bad-block storage of the first embodiment of the present invention.

FIG. 4 shows the bad-block storage 41 of the bad-block storage unit 40 of the first embodiment. The bad-block storage unit 40 in this embodiment stores the block valid/invalid information of 1024 blocks. The bad-block storage 41 of FIG. 4 includes: memory cells BBC0 to BBC1023 which store the block valid/invalid information; word lines WLB0, WLB16, WLB 32, . . . WLB16367 for the bad-block storage corresponding to the addresses of the respective blocks; select transistors TrD0 to TrD1023 for controlling the connection between the memory cells BBC0 to BBC1023 and a bit line; signal conductors SLDB0 to SLDB1023 for the select transistors TrD0 to TrD1023; select transistors TrS0 to TrS1023 for controlling the connection between the memory cells BBC0 to BBC1023 and the array (GND); and signal conductors SLSB0 to SLSB1023 for the select transistors TrS0 to TrS1023.

The select transistors TrDn, the memory cells BBCn, and the select transistors TrSn are connected in series, and the memory cells BBCn correspond to the block valid/invalid information on a one-for-one basis. Here, "n" indicates one of the numbers from 0 to 1023. The select transistors TrDn, the memory cells BBCn, and the select transistors TrSn correspond to the select transistors TrDn, the memory cells BBCn, and the select transistors TrSn of the memory cell array 26, respectively. The Y gate 42 and the sense amplifier 43 also correspond to the Y gate 28 and the sense amplifier 30, respectively. Writing, erasing, and reading can be carried out in the bad-block storage 41 as well as in the memory cell array 26.

In accordance with a command signal or a high-voltage signal supplied to the control and high-voltage circuit 22 shown in FIG. 3, the operation mode is switched to a bad block mode. In the bad block mode, the block valid/invalid information is read out from the bad-block storage unit 40. After the operation mode is switched to the bad block mode, the row address decoder 18 decodes a supplied address signal to generate a block address signal, and the word line WLBn for the bad-block storage corresponding to the block address signal is selected. The select transistor TrDn and the select transistor TrSn corresponding to the block address signal are controlled when necessary.

In accordance with the selected word line WLBn for the bad-block storage, the memory cell BBCn corresponding to the block address signal is selected, and the condition of the selected memory cell BBCn is read out. Fluctuations in the level of the bit line are sent to the sense amplifier 43 via the Y gate 42, and the sense amplifier 43 judges the block valid/invalid information stored in the memory cell BBCn. For instance, if the current does not flow through the memory cell BBCn, the condition is judged to be "0", i.e., a bad block, and if the current flows through the memory cell BBCn, the condition is judged to be "1", i.e., not a bad block. When the level fluctuations are not detected by the sense amplifier 43, the block valid/invalid information indicates a bad block. When the sense amplifier 43 detects level fluctuations, the block valid/invalid information does not indicate a bad block. The block valid/invalid information judged by the sense amplifier 43 is then latched by the data register 32, and is outputted along with a clock signal to the outside via the input/output control circuit 34.

Figure 5:
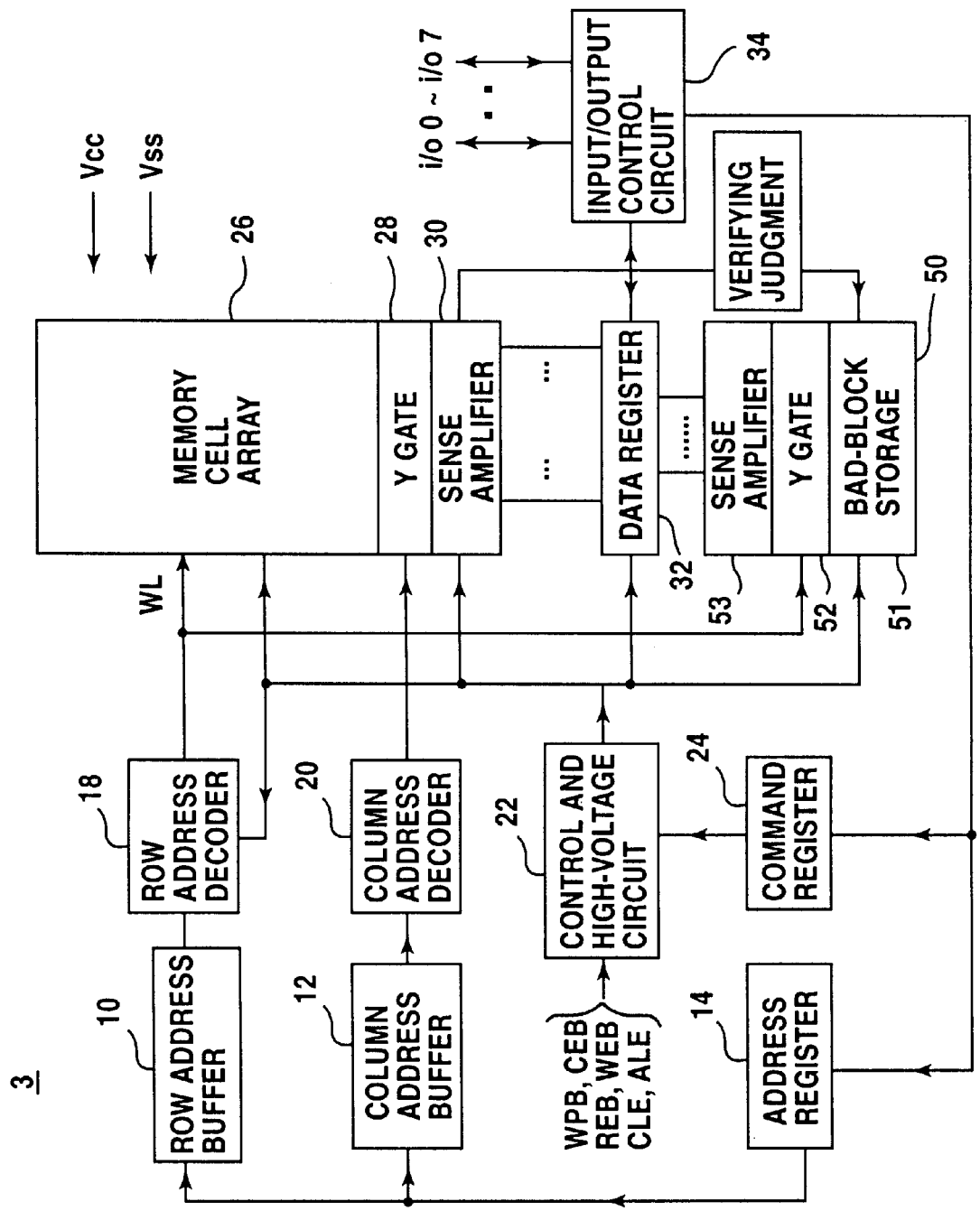
FIG. 5 is a block diagram of a second embodiment of a semiconductor memory device of the present invention.

Referring now to FIG. 5, a second embodiment of the present invention will be described. In the second embodiment, the block valid/invalid information can be read at higher speed than in the first embodiment. FIG. 5 is a block diagram of the second embodiment of a semiconductor memory device of the present invention. In this block diagram, the same components as in the block diagram of FIG. 3 are indicated by the same reference numerals.

A semiconductor memory device 3 shown in FIG. 5 differs from the semiconductor memory device 2 shown in FIG. 3 in the structure of the bad-block storage unit. A bad-block storage unit 50 of this embodiment comprises a bad-block storage 51, a Y gate 52, and a sense amplifier 53. The Y gates 28 and 52 conduct switching between the bad-block storage 51 and the memory cell array 26. In accordance with a command signal or a high-voltage signal supplied to the control and high-voltage circuit 22, the switching is performed between the Y gates 28 and 52. A signal for selecting from data in the bad-block storage 51 is supplied from the row address decoder 18, and the block valid/invalid information corresponding to a subject block is read out. With this structure, the block valid/invalid information that has been written in a predetermined position in each block can be written in the bad-block storage unit 50.

Figure 6:
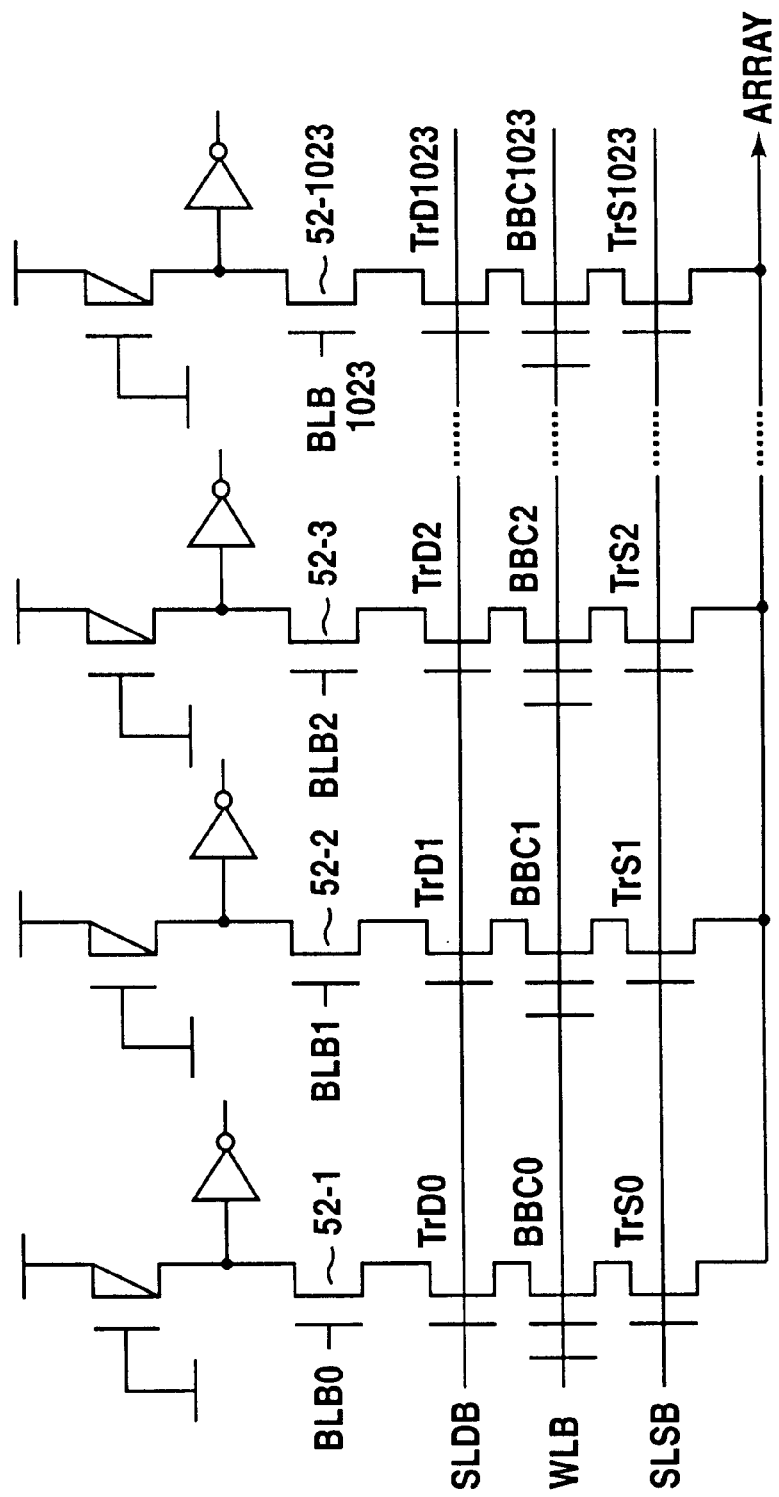
FIG. 6 is a circuit diagram of a bad-block storage of the second embodiment of the present invention.

Referring now to FIG. 6, the bad-block storage unit 50 will be described in detail. FIG. 6 is a circuit diagram of the bad-block storage unit of the second embodiment. The bad-block storage unit 50 also stores the block valid/invalid information of 1024 blocks. The bad-block storage 51 of FIG. 6 includes: memory cells BBC0 to BBC1023 which store the block valid/invalid information; bit lines BLB0 to BLB1023 for the bad-block storage corresponding to the addresses of the respective blocks; select transistors 52-1 to 52-1023 for controlling the connection among the bit lines BLB0 to BLB1023 for the bad-block storage; a word line WLB for the back block storage; select transistors TrD0 to TrD1023 for controlling the connection between the memory cells BBC0 to BBC1023 and the bit lines BLB0 to BLB1023; a signal conductor SLDB for the select transistors TrD0 to TrD1023; select transistors TrS0 to TrS1023 for controlling the connection between the memory cells BBC0 to BBC1023 and the array (GND); and a signal conductor SLSB for the select transistors TrS0 to TrS1023.

The select transistors TrDn, the memory cells BBCn, and the select transistors TrSn are connected in series, and the memory cells BBCn correspond to the block valid/invalid information on a one-for-one basis. Here, "n" indicates one of the numbers from 0 to 1023. The select transistors TrDn, the memory cells BBCn, and the select transistors TrSn correspond to the select transistors TrDn, the memory cells BBCn, and the select transistors TrSn of the memory cell array 26, respectively. The Y gate 52 and the sense amplifier 53 also correspond to the Y gate 28 and the sense amplifier 30, respectively. Writing, erasing, and reading can be carried out in the bad-block storage 51 as well as in the memory cell array 26.

In accordance with a command signal or a high-voltage signal supplied to the control and high-voltage circuit 22 shown in FIG. 5, the operation mode is switched to a bad block mode. In the bad block mode, the block valid/invalid information is read out from the bad-block storage unit 50. After the operation mode is switched to the bad block mode, the row address decoder 18 decodes a supplied address signal to generate a block address signal, and the bit line BLBn for the bad-block storage corresponding to the block address signal is selected. In this case, The block valid/invalid information of a corresponding block is read out. However, a plurality of bit lines BLBn or all of the bit lines BLBn can be selected, for instance, by latching, so that the block valid/invalid information of a plurality of blocks or all of the blocks can be read out simultaneously.

By selecting the select transistor TrDn, the block valid/invalid information corresponding to the block address can be read from the memory cell BBCn to the selected bit line. Fluctuations in the level of the bit lines are sent to the sense amplifier 53 via the select transistor 52-n, and the sense amplifier 53 judges the block valid/invalid information stored in the memory cell BBCn. The block valid/invalid information judged by the sense amplifier 53 is then latched by the data register 32, and is outputted along with a clock signal to the outside via the input/output control circuit 34.

In the circuit diagram of FIG. 6, the block valid/invalid information of a plurality of blocks or all of the blocks can be supplied to the data register 32 at once. Compared with the circuit diagram of FIG. 4, the bit lines of FIG. 6 are shorter, and so is the charging time. After the block valid/invalid information of a plurality of blocks or all of the blocks is supplied to the data register 32, the block valid/invalid information is read out sequentially with the clock signal. Thus, the block valid/invalid information can be read at higher speed.

Figure 7:
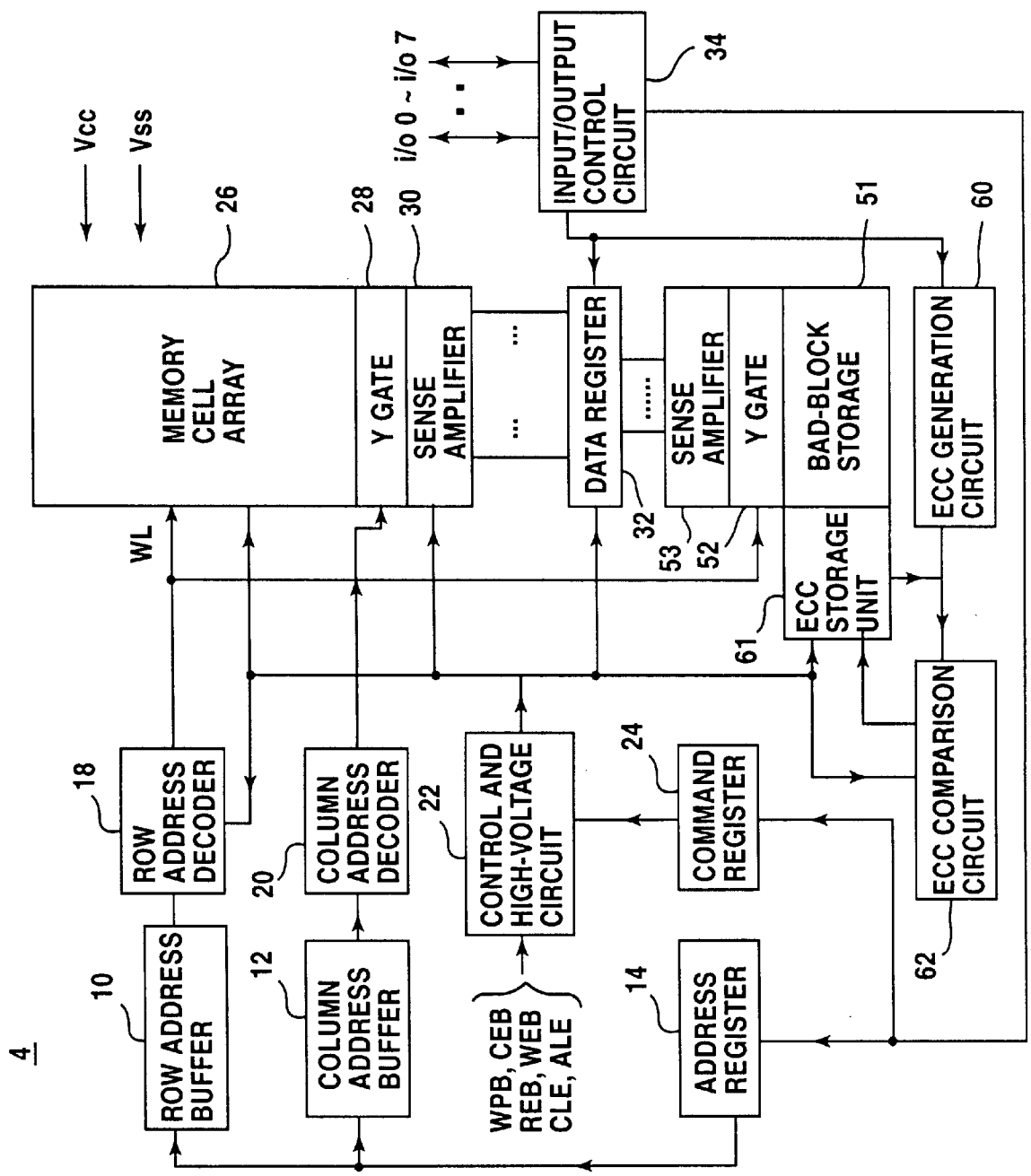
FIG. 7 is a block diagram of a third embodiment of a semiconductor memory device of the present invention.

Referring now to FIG. 7, a third embodiment of a semiconductor memory device of the present invention will be described below. In this embodiment, a new bad block occurrence during an operation of the semiconductor memory device can be dealt with. FIG. 7 is a block diagram of the third embodiment of the semiconductor memory device of the present invention. In this block diagram, the same components as in the block diagram of FIG. 5 are indicated by the same reference numerals.

The block diagram of a semiconductor memory device 4 of FIG. 7 includes an ECC (Error Correction Code) generation circuit 60, an ECC storage unit 61, and an ECC comparison circuit 62. When data supplied from the outside is to be written, the data is sent to the data register 32 via the input/output control circuit 34, and the same data is sent to the ECC generation circuit 60 to produce an ECC (1). The data register 32 writes the data in a predetermined block in the memory cell array 26. The ECC generation circuit 60 stores the ECC (1) in the ECC storage unit 61. The ECC (1) stored in the ECC storage unit 61 is associated with the block in which the original data of the ECC (1) is stored. The structure of the ECC storage unit 61 can be the same as the bad-block storage unit 50.

When data is read out, the data is read from the memory cell array 26, and is supplied to the data register 32. The data register 32 holds the data sent from the memory cell array 26, and also supplies the same data to the ECC generation circuit 60 to generate an ECC (2). The ECC generation circuit 60 then supplies the generated ECC (2) to the ECC comparison circuit 62. The ECC storage unit 61 supplies the ECC comparison circuit 62 with the ECC (1) of the data to be read out. The ECC comparison circuit 62 compares the ECC (1) with the ECC (2). If the ECC (1) coincides with the ECC (2), the data held in the data register 32 is outputted to the outside via the input/output control circuit 34. If the ECC (1) does not coincide with the ECC (2), block valid/invalid information which indicates the read block is a bad block is written in the bad-block storage 51. Thus, a new bad block occurrence during an operation of the semiconductor memory device can be dealt with by updating the block valid/invalid information.

The present invention is not limited to the specifically disclosed embodiments, but variations and modifications may be made without departing from the scope of the present invention.

The present application is based on Japanese priority application No. 10-332884, filed on Nov. 24, 1998, the entire contents of which are hereby incorporated for reference.

What is claimed is:

1. A semiconductor memory device comprising:

a memory cell array including blocks, each of the blocks having memory cells arranged in rows and columns; and a valid/invalid information storage unit which is provided outside of and connected to the memory cell array and stores pieces of valid/invalid information respectively indicating whether the blocks are valid or invalid.

2. The semiconductor memory device as claimed in claim 1, wherein the valid/invalid information storage unit comprises non-volatile memory cells respectively storing pieces of valid/invalid information.

3. The semiconductor memory device as claimed in claim 1, wherein the valid/invalid information storage unit comprises:

non-volatile memory cells respectively storing the pieces of valid/invalid information; and word lines respectively connected to the non-volatile memory cells, the word lines being selected by a block address.

4. The semiconductor memory device as claimed in claim 3, wherein the valid/invalid information storage unit comprises a bit line commonly connected to the non-volatile memory cells.

5. The semiconductor memory device as claimed in claim 1, wherein the valid/invalid information storage unit comprises:

non-volatile memory cells respectively storing the pieces of valid/invalid information; and bit lines respectively connected to the non-volatile memory cells, said bit lines being also connected to the memory cell array.

6. The semiconductor memory device as claimed in claim 5, wherein the valid/invalid information storage unit comprises a word line commonly connected to the non-volatile memory cells.

7. The semiconductor memory device as claimed in claim 1, wherein the valid/invalid information storage unit comprises:

a gate unit which controls output of the valid/invalid information read from the memory cell array; and a sense amplifier which judges the valid/invalid information supplied from the gate unit, and outputs the valid/invalid information.

8. The semiconductor memory device as claimed in claim 7, wherein the valid/invalid information storage unit collectively reads out the valid/invalid information from the memory cells at once.

9. The semiconductor memory device as claimed in claim 8, further comprising:

an error correction code generation circuit which generates an error correction code from data to be written in or read from the memory cell array;

an error correction code storage unit which stores the error correction code generated when the data is written; and an error correction code comparison unit which compares the error correction code generated when the data is written with the error correction code generated when the data is read out, wherein, if the error correction code comparison unit judges that the error correction code generated when the data is written does not coincide with the error correction code generated when the data is read out, the valid/invalid information stored in the valid/invalid information storage unit is updated.

* * * * *